(12) United States Patent
Wang et al.

(10) Patent No.: US 10,667,392 B2
(45) Date of Patent: May 26, 2020

(54) METHOD FOR MANUFACTURING THROUGH WIRING SUBSTRATE AND METHOD FOR MANUFACTURING DEVICE

(71) Applicant: CANON KABUSHIKI KAISHA, Tokyo (JP)

(72) Inventors: Shinan Wang, Komae (JP); Yutaka Setomoto, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 487 days.

(21) Appl. No.: 15/364,001

(22) Filed: Nov. 29, 2016

(65) Prior Publication Data

US 2017/0156209 A1 Jun. 1, 2017

(30) Foreign Application Priority Data

Dec. 1, 2015 (JP) .................. 2015-234361

(51) Int. Cl.
*H05K 1/11* (2006.01)
*G01N 29/06* (2006.01)
(Continued)

(52) U.S. Cl.
CPC ......... *H05K 1/116* (2013.01); *G01N 29/0654* (2013.01); *G01N 29/2406* (2013.01); *H05K 1/18* (2013.01); *H05K 3/0011* (2013.01); *H05K 3/22* (2013.01); *H05K 3/26* (2013.01); *H05K 3/303* (2013.01); *H05K 3/4038* (2013.01);
(Continued)

(58) Field of Classification Search
CPC ...... H05K 1/116; H05K 3/426; H05K 3/4038; H05K 3/22; H05K 3/0011; H05K 3/26; H05K 3/303; H05K 1/18; H05K 2203/025; H05K 2203/0152; H05K 1/16; H05K 1/0306; H05K 2201/09763;
(Continued)

(56) References Cited

U.S. PATENT DOCUMENTS

| 6,646,338 B2 | 11/2003 | Hashimoto | |
| 2001/0023779 A1* | 9/2001 | Sugaya | H05K 1/16 174/255 |

(Continued)

FOREIGN PATENT DOCUMENTS

| JP | 2008-135482 A | 6/2008 |
| JP | 2012-28533 A | 2/2012 |

(Continued)

*Primary Examiner* — Xin Y Zhong
(74) *Attorney, Agent, or Firm* — Canon U.S.A., Inc. IP Division

(57) ABSTRACT

The present invention offers a device requiring a reduced number of manufacturing processes and providing high electrical reliability, and a method for manufacturing the device. The method for manufacturing the device forms through holes in a substrate, fills the through holes with a conductive material through electroplating from a first surface side of the substrate, polishes the conductive material to form through wirings, and forms an element portion on the first surface side. Then, the method processes the substrate so that the positions of the end faces of the through wirings measured from the substrate surface on the first surface side are made smaller in depth than the positions of the end faces of the through wirings measured from the substrate surface on the second surface side.

6 Claims, 9 Drawing Sheets

(51) Int. Cl.
*H05K 3/42* (2006.01)
*G01N 29/24* (2006.01)
*H05K 1/18* (2006.01)
*H05K 3/00* (2006.01)
*H05K 3/22* (2006.01)
*H05K 3/26* (2006.01)
*H05K 3/30* (2006.01)
*H05K 3/40* (2006.01)
*B06B 1/02* (2006.01)
*H05K 1/03* (2006.01)
*H05K 1/16* (2006.01)

(52) U.S. Cl.
CPC ............ *H05K 3/426* (2013.01); *B06B 1/0292* (2013.01); *H05K 1/0306* (2013.01); *H05K 1/16* (2013.01); *H05K 2201/09763* (2013.01); *H05K 2201/10083* (2013.01); *H05K 2201/10151* (2013.01); *H05K 2203/0152* (2013.01); *H05K 2203/025* (2013.01)

(58) Field of Classification Search
CPC .......... H05K 2201/10151; H05K 2201/10083; G01N 29/0654; G01N 29/2406; B06B 1/0292

See application file for complete search history.

(56) References Cited

U.S. PATENT DOCUMENTS

2009/0149023 A1* 6/2009 Koyanagi ......... H01L 21/76898
    438/666
2011/0169510 A1* 7/2011 Kandori ............... B06B 1/0292
    324/686
2014/0318255 A1* 10/2014 Torashima ........... B06B 1/0292
    73/627
2016/0330836 A1* 11/2016 Mizutani ............... H05K 1/115

FOREIGN PATENT DOCUMENTS

JP   2015128271 A   7/2015
JP   2015177382 A   10/2015

* cited by examiner

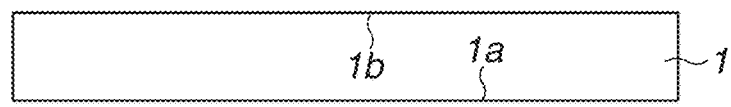
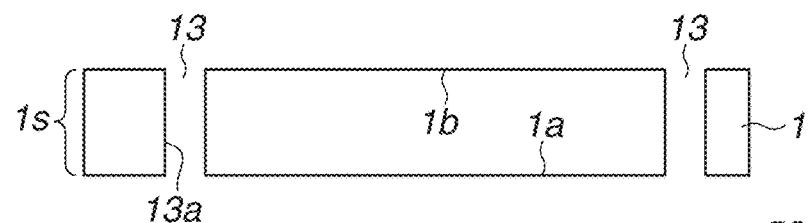
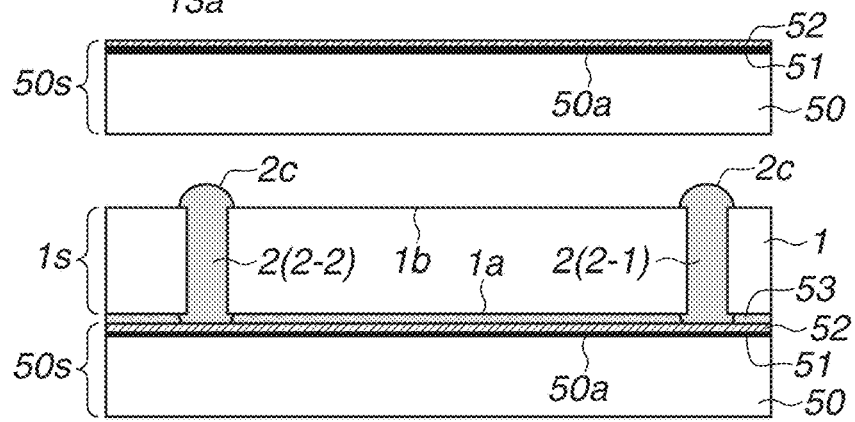
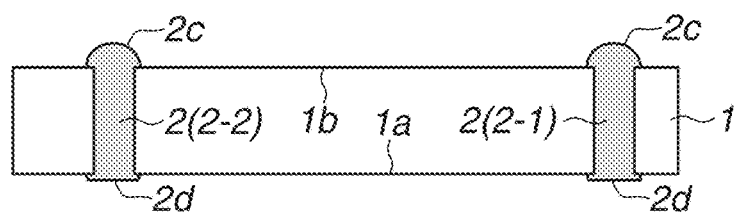
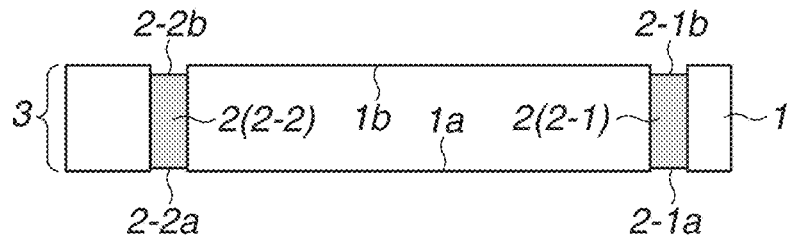
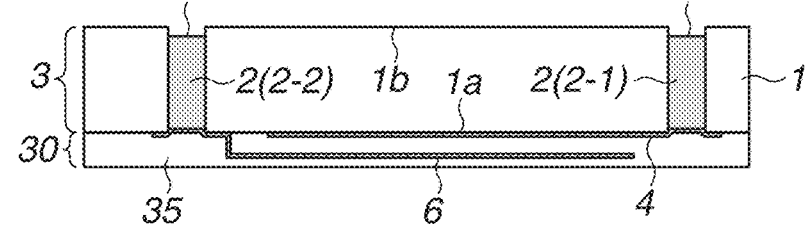
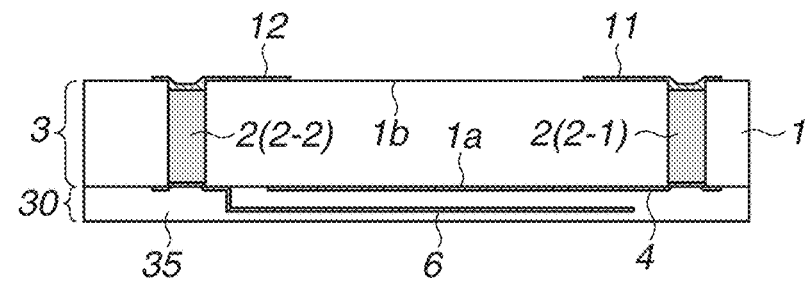

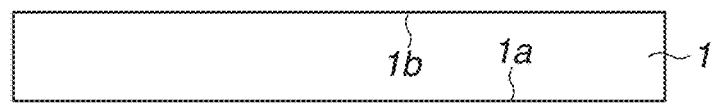
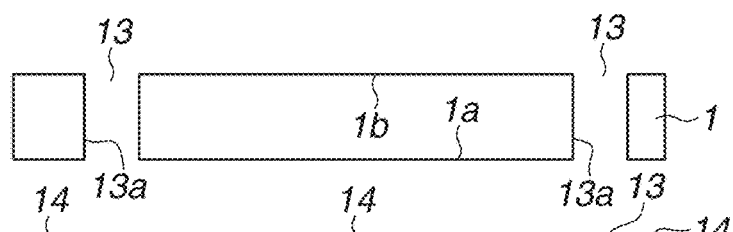
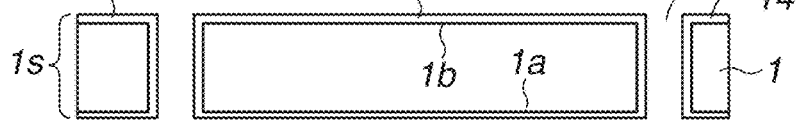
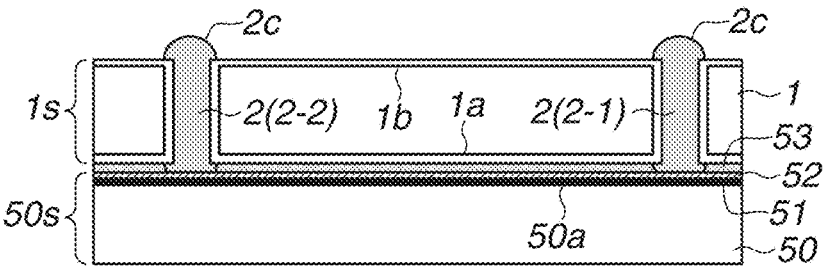
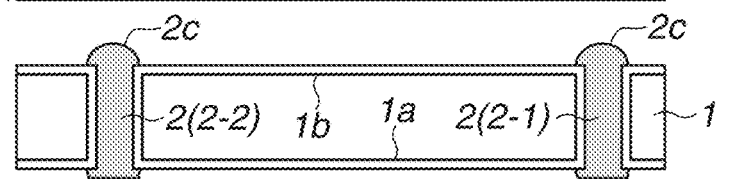
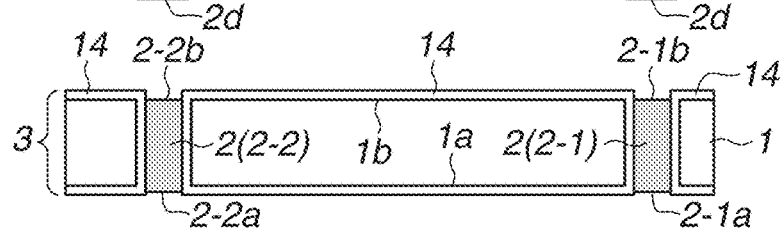
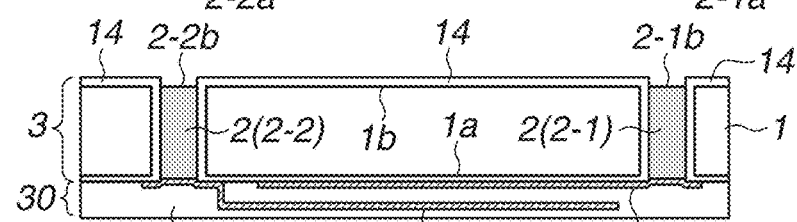
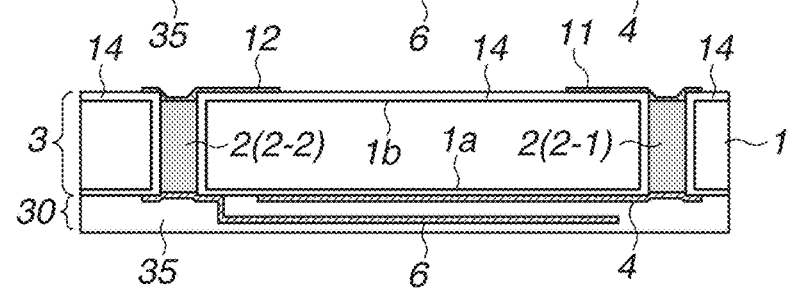

METHOD FOR MANUFACTURING THROUGH WIRING SUBSTRATE AND METHOD FOR MANUFACTURING DEVICE

BACKGROUND

Field of the Disclosure

The present disclosure relates to a through wiring substrate, a device having the through wiring substrate, and a method for manufacturing the substrate and the device.

Description of the Related Art

With the decrease in size and the increase in the functionality including the processing speed and versatility, a through wiring is used to enable, at the shortest distance, electrical connection between chins constituting a device or between elements on the substrate front surface and electrode pads on the substrate rear surface. For example, after forming through holes which penetrate through a substrate, the through holes are filled with a conductive material. Then, element electrodes on the front surface side of the substrate are electrically connected with electrode pads on the rear surface side of the substrate via through wirings formed of the conductive material. Methods for filling through holes with a conductive material include the electroplating method. With a high aspect ratio of through holes, bottom-up electroplating in which a seed layer is formed at one ends of through holes is effective to obtain reliable through wirings. Generally after plating, the conductive material protruding from both ends of the through holes is polished to be planarized so that both end faces of the conductive material become as high as the substrate surfaces. The conductive material planarized in this way serves as through wirings.

The plated conductive material has uneven protruding height and uneven polishing. Therefore, for all through holes, it is necessary to concave the end faces of the through wirings from the substrate surfaces to remove protruding portions of the conductive material. The larger the protruding height of the conductive material, the longer the polishing time and the larger the uneven polishing. The larger the uneven plating and uneven polishing, the larger the number of through wirings having end faces largely concaved from the substrate surfaces, i.e., the larger the number of through wirings with a large depth of the positions of the end faces from the substrate surfaces.

Further, at the time of polishing, end faces of the conductive material are plastically deformed by mechanical stress, possibly causing gaps between the through wirings and the inner walls of the through holes. The larger the amount of polishing, the larger the gaps. Meanwhile, a large depth of the end faces of the through wirings or a large gap between the through wirings and the through holes is likely to cause the following problems when forming elements on a substrate having through wirings:

(1) in the vicinity of through wirings, the uniformity in film thickness of a thin film configuring elements degrades and the membrane stress distribution on the thin film increases. Therefore, variations in the element characteristics are likely to increase. To decrease variations the element characteristics, it is possible to avoid arranging elements in the vicinity of through wirings. In this case, however, the integration degree of elements will decrease.
(2) At end faces of through wirings, electrical connection with element electrodes or electrode pads may possibly be degraded.
(3) Large unevenness on the substrate surfaces makes it difficult to manufacture minute patterns.

Japanese Patent Application Laid-Open No. 2008-135482 discusses a technique for reducing a gap arising between a through wiring and the inner wall of a through hole due to polishing. In the technique discussed in Japanese Patent Application Laid-Open No. 2008-135482, both end faces of a main portion of a through wiring is provided with contact portions formed of a conductive material having a higher elastic modulus than the main portion. Accordingly, at the time of polishing, since the conductive material having a high elastic modulus provides small plastic deformation, a gap hardly arises between the through wiring and the inner wall of the through hole.

However, in the technique discussed in Japanese Patent Application Laid-Open No. 2008-135482, it is necessary to perform plating three times by using different materials to form the main portion of the through wiring and the contact portions at both end faces of the main portion, resulting in complicated manufacturing processes. Further, since the main portion and the contact portions of the through wiring are formed of different materials, a contraption for mutual adhesiveness may be required.

SUMMARY

According to an aspect of the present disclosure, a method for manufacturing a device provided with an element portion on a substrate having through wirings includes, forming through holes ranging from a first surface of the substrate to a second surface thereof positioned on an opposite side of the first surface, filling the through holes with a conductive material, forming through wirings polishing the conductive material put in the through holes, and forming an element portion on the first surface side. When forming the through wirings, positions of end faces of the through wirings measured from a substrate surface on the first surface side are made smaller in depth than positions of end faces of the through wirings measured from a substrate surface on the second surface side. According to another aspect of the present disclosure, a method for manufacturing a substrate having through wirings includes, forming through holes ranging from a first surface of the substrate to a second surface thereof positioned on an opposite side of the first surface, filling the through holes with a conductive material, and forming through wirings by polishing the conductive material put in the through holes. When forming the through wirings, positions of end of the through wirings measured from a substrate surface on the first surface side are made smaller in death than positions of end faces of the through wirings measured from a substrate surface on the second surface side.

According to an aspect of the present disclosure, a device provided with an element portion on a substrate having through wirings includes, through holes ranging from a first surface of the substrate to a second surface thereof positioned on an opposite side of the first surface, through wirings formed of a conductive material for filling insides of the through holes, and an element portion disposed on the first surface side and electrically connected with the through wirings. Positions of end faces of the through wirings measured from a substrate surface on the first surface side are smaller in depth than positions of end faces of the through wirings measured from a substrate surface on the second surface side. According to another aspect of the present disclosure, a through wiring substrate having through wirings includes, through holes ranging from a first surface of the substrate to a second surface thereof positioned on an opposite side of the first surface, and through wirings formed of a conductive material for filling insides of the through holes. Positions of end faces of the through wirings measured from a substrate surface on the first surface side are smaller in depth than positions of end faces of the through wirings measured from a substrate surface on the second surface side.

Further features of the present disclosure will become apparent from the following description of exemplary embodiments with reference to the attached drawings.

BRIEF DESCRIPTION OF THE DRAWINGS

FIGS. 1A, 1B, 1C, 1D, 1E, 1F, 1G, and 1H are cross-sectional views illustrating a method for manufacturing a device according to one or more aspects of the present disclosure.

FIGS. 3A, 3B, 3C, 3D, 3E, 3F, 3G, 3H, and 3I are cross-sectional views illustrating a method for manufacturing a device according to one or more aspects of the present disclosure.

DESCRIPTION OF THE EMBODIMENTS

Figure 2:
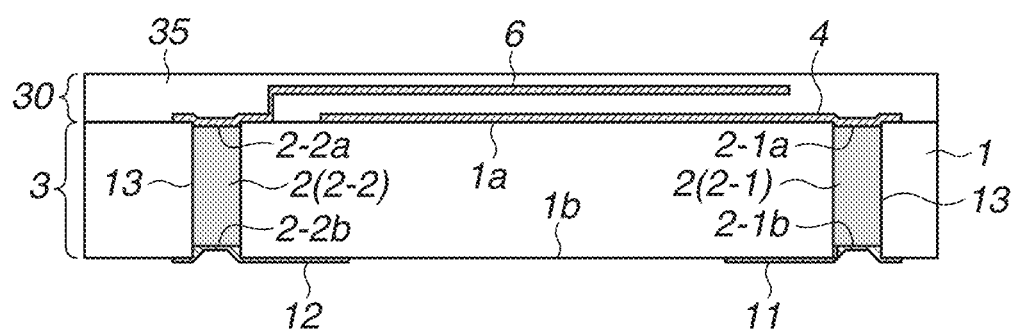
FIG. 2 is a cross-sectional view illustrating a device structure according to one or more aspects of the present disclosure.

A through wiring substrate according to an aspect of the present disclosure has through wirings formed of one kind of conductive material formed in through holes, and is provided with a substrate surface having a reduced depth of end faces of through wirings measured from the substrate surface. Therefore, if a plurality of element portions is formed on that surface side, such effects as a uniform film thickness of a thin film configuring the element portions and uniform membrane stress can be acquired even in the vicinity of through wirings. Since one kind of conductive material is used for through wirings, it is possible to manufacture a device having small variations in the characteristics of the element portions and providing high electrical reliability through a comparatively small number of processes.

Exemplary embodiments of the present disclosure will be described below with reference to the accompanying drawings. However, the present disclosure is not limited to these exemplary embodiments but can be modified in diverse ways within the ambit of the appended claims.

A method for manufacturing a device according to a first exemplary embodiment of the present disclosure will be described below with reference to FIGS. 1A to 1H. FIGS. 1A to 1H are cross-sectional views illustrating the present exemplary embodiment. Although, in device manufacture, it is common to simultaneously form a plurality of through wirings or a plurality of elements on one substrate, FIGS. 1A to 1H illustrate only two through wirings and one element to make the drawings simple and legible.

First of all, as illustrated in FIG. 1A, a first substrate 1 is prepared. The first substrate 1 is, for example, an insulated substrate represented by glass or a semiconductor substrate represented by Si. The first substrate 1 has a first surface 1a and a second surface 1b positioned on the opposite side of the first surface 1a. Both the first surface as and the second surface 1b of the first substrate 1 are flat and are polished to be a mirror surface. The first substrate 1 is, for example, 50 to 1000 µm thick.

Then, as illustrated in FIG. 1B, through holes 13 are formed in the first substrate 1. The through holes 13 range from the first surface 1a of the first substrate 1 to the second surface 1b thereof, i.e., they penetrate through the first substrate 1. The shape, the size, the number, and the arrangement of the through holes 13 are defined by a photoresist pattern according to use. The through holes 13, each having a circular-shaped cross-section with a 20 to 100 µm diameter, for example, are arranged in an array form at horizontal intervals of 200 µm and at vertical intervals of 2 mm. After forming the through holes 13, an insulated film or a diffusion preventing film (also referred to as a barrier layer) for preventing metal diffusion is formed on side walls 13a of the through holes 13 as required. Both an insulated film and a diffusion preventing film may be formed. This completes a through substrate 1s.

Then, as illustrated in FIG. 1C, a seed substrate 50s is formed. First of all, a second substrate 50 is prepared. The second substrate 50 is a metal substrate, for example, a SUS substrate. The second substrate 50 is, for example, about 300 µm thick. At least one main surface 50a of the second substrate 50 is planarized. Surface coarseness Ra (arithmetic average coarseness) of the main surface 50a is desirably 50 nm or less. An intermediate layer 51 is formed on the main surface 50a of the second substrate 50. A. seed film 52 is formed on the intermediate layer 51. The adhesiveness between the intermediate layer 51 and the second substrate 50 is lower than the adhesiveness between the seed film 52 and the second substrate 50. More specifically, when each of the intermediate layer 51 and the seed film 52 is directly formed on the main surface 50a of the second substrate 50, the adhesiveness between the intermediate layer 51 and the main surface 50a is lower than the adhesiveness between the seed film 52 and the main surface 50a. The intermediate layer 51 is a conductive film and is desirably 1 to 100 nm thick. The intermediate layer 51 is formed, for example, by using the vacuum evaporation method. The seed film 52 is a metal film. More desirably, the main component of the seed film 52 is the same as that of a conductive material 2 to be plated as illustrated in FIG. 1D. Methods for forming the seed film 52 include vacuum deposition and sputtering. The seed film 52 is desirably 10 to 200 nm thick. The second substrate 50 with the intermediate layer 51 and the seed film 52 formed thereon is the seed substrate 50s.

Then, as illustrated in FIG. 1D, the through substrate 1s and the seed substrate 50s are bonded together, and the through holes 13 (see FIG. 1B) are filled with the conductive material 2 (including end faces 2-1 and 2-2) through electroplating. In this case, the first surface 1a of the first substrate 1 is bonded onto the seed film 52 via an adhesive substance 53. The adhesive substance 53 is, for example, a material which dissolves in water or organic solvent. The adhesive substance 53 is uniformly formed on the seed film 52, for example, by using the spin coating method. Adjusting the thickness and viscosity of the adhesive substance 53 and spin coating conditions enables controlling the thickness of the adhesive substance 53. Controlling the thickness of the adhesive substance 53 in this way enables controlling the gap between the first surface 1a of the first substrate 1 and the seed film 52. The thickness of the adhesive substance 53 is, for example, 10 µm or less.

After bonding together the through substrate 1s and the seed substrate 50s, the adhesive substance 53 at the bottoms of the through holes 13 is partially removed to expose the seed film 52. Then, electricity is supplied to the seed substrate 50s to perform electroplating, starting from the seed film 52 exposed at the bottoms of the through holes 13. Plating is, for example, Cu electroplating using a solution of copper sulfate. Plating is performed from the first surface 1a side of the through substrate 1s toward the second surface 1b side thereof. All of the through holes 13 are filled with the conductive material 2 without gaps. To enable comparatively equalizing the depth of the end faces of the through wrings on the first surface 1a. side in the planarization process illustrated in FIG. 1F, plating is performed so that end-of-plating end faces 2c of the conductive material 2 exceed the second surface 1b. The average height of the end-of-plating end faces 2c of the conductive material 2 protruding from the second surface 1b is determined by the uniformity in plating in the substrate, and is, for example, 10 µm or larger. On the other hand, the height of start-of-plating end faces 2d (see FIG. 1E) of the conductive material 2 in close contact with the seed film 52 protruding from the first surface 1a is almost the same as the thickness of the adhesive substance 53. Since the first surface 1a of the through substrate 1s and the main surface 50a of the seed substrate 50s are flat and smooth, the adhesive substance 53 formed at the interface between these surfaces has good uniformity and controllability in thickness. As a result, the start-of-plating end faces 2d of the conductive material 2 have good uniformity and controllability in height. The average height of the start-of-plating end faces 2d of the conductive material 2 is, for example, 10 µm or less.

Then, as illustrated in FIG. 1E, at the interface between the intermediate layer 51 and the second substrate 50, the plated conductive material 2 (including the end faces 2-1 and 2-2) is separated from the second substrate 50. In this case, the conductive material 2 remains in the through holes 13 (see FIG. 1B) of the first substrate 1. To separate the conductive material 2 from the second substrate 50, the adhesive substance 53 is dissolved rn water or an organic solvent and then removed. Then, the through substrate 1s and the seed substrate 50s are connected only by the start-of-plating end faces of the conductive material 2. Small stress is applied to the interface between the through substrate 1s and the seed substrate 50s to separate the conductive material 2 from the second substrate 50. Since the intermediate layer 51 which is easy to separate is formed, separation hardly causes deformation or damage on the start-of-plating end faces 2d of the conductive material 2. Although, in this case, the seed film 52 and the intermediate layer 51 remain on the start-of-plating end faces 2d of the conductive material 2, the seed film 52 and the intermediate layer 51 are thin and therefore can be removed at the same time in the planarization process illustrated in FIG. 1F.

Then, as illustrated in FIG. 1F, the end faces 2c and 2d of the conductive material 2 are planarized. The planarized conductive material 2 becomes the through wirings 2 (including the end faces 2-1 and 2-2). For example, Chemical Mechanical Polishing (CMP) is used for planarization processing. After planarization, end faces 2-1a and 2-2a of the through wirings 2 desirably have almost the same height as the first surface 1a of the first substrate 1. Likewise, end faces 2-1b and 2-2b of the through. wirings 2 desirably have almost the same height as the second surface 1b of the first substrate 1. However, after plating, there are uneven height and uneven CMP of the end races 2c or 2d.

Figure 8:
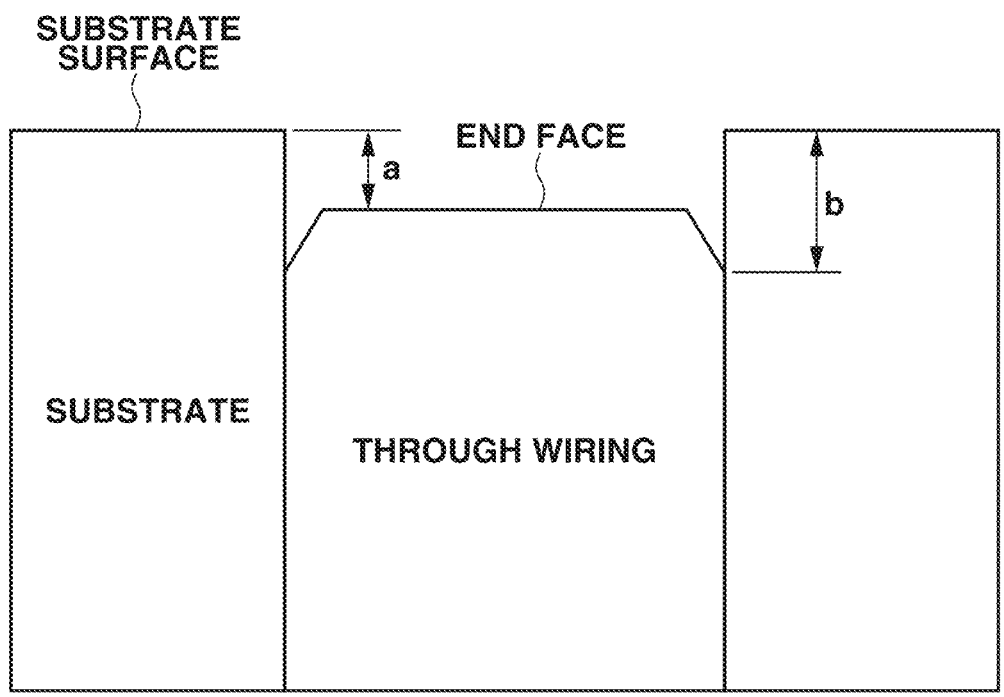
FIG. 8 illustrates an average dishing amount and an average gap depth.

Therefore, to remove protruded portions of the conductive material 2 in ail of the through holes 13, it is necessary to concave the end faces 2-1a and 2-2a or the end faces 2-1b and 2-2b of the through wirings 2 after CMP from the substrate surfaces, i.e., to achieve the dishing state. Gaps arise between the through wirings 2 and the inner walls 13a (see FIG. 1B) of the through holes 13 by the plastic deformation at the time of CMP. An average dishing amount a and an average gap depth b as illustrated in FIG. 8 increase with increasing amount of CMP (equivalent to the height of the end faces 2c or 2d after plating) and increasing uneven plating.

The start-of-plating end faces 2d of the conductive material 2 obtained in FIG. 1E are lower in height and have better uniformity in height than the end-of-plating end faces 2c. Therefore, the end faces 2-1a and 2-2a of the through wirings 2 after CMP can be made smaller in average dishing amount and average gap depth than the end faces 2-1b and 2-2b. In this case, the larger one of the average amount of dishing in the dishing state concaved from the substrate surfaces and the average depth of gaps arisen between the through wirings 2 and the inner walls of the through holes 13 is defined as the depth of the end faces of the through wirings measured from the substrate surfaces. The positions of the end. faces of the through wirings 2 on the second surface 1b side of the substrate 1 have, for example, a depth of 1 µm or less. The positions of the end faces of the through wirings 2 on the first. surface 1a side of the substrate 1 are smaller in depth than the positions of the end faces of the through wirings 2 on the second surface 1b side of the substrate 1, and have, for example, a depth of 0.5 µm or less. According to the above-described processes, the substrate can be processed so that the positions of the end faces 2-1a and 2-2a of the through wirings 2 on the first surface 1a side of the substrate become smaller in depth than the positions of the end faces 2-1b and 2-2b of the through wirings 2 on the second surface 1b side. This completes a through wiring substrate 3 in which the through wirings 2 are formed in the through substrate 1s (see FIG. 1B).

Then, as illustrated in FIG. 1G, an element portion 30 is formed on the first surface 1a of the first substrate 1. The element portion 30 includes electrode portions (including a first electrode 4 and a second electrode 6) and the other portion 35. The electrodes are formed of a metal material. The first electrode 4 is electrically connected with the end face 2-1a (see FIG. 1F) of the through wiring 2. The second electrode 6 is electrically connected with the end face 2-2a (see FIG. 1F) of the through wiring 2. The element portion 30 is, for example, any one of various kinds of MEMS (Micro Electro Mechanical System) elements. More specifically, the element portion 30 is, for example, a Capacitive Micromachined Ultrasonic Transducer (CMUT) or piezoelectric transducer. The structure of the element portion 30 is designed according to the device specifications. For example, the element portion 30 is a CMUT which includes the first electrode 4, the second electrode 6 disposed to face the first electrode 4 across a gap, and a vibratably supported vibrating membrane consisting of insulated films disposed above and below the second electrode 6. The element portion 30 is a piezoelectric transducer including the first electrode 4, the second electrode 6, and a piezo-electric member sandwiched between the first electrode 4 and second electrode 6. The element portion 30 is formed on the first surface 1a side of the first substrate 1 on which the end faces of the through wirings 2 are reduced in depth. Therefore, even in the vicinity of the through wirings 2, the element portion 30 has good uniformity in film thickness of the thin films configuring the element portion 30 and in membrane stress.

Then, as illustrated in FIG. 1H, electrode pads 11 and 12 are formed on the second surface 1b side of the first substrate 1. The electrode pad 11 is connected with the end face 2-1b (see FIG. 1G) of the through wiring 2. The electrode pad 12 is connected with the end face 2-2b (see FIG. 1G) of the through wiring 2. The electrode pads 11 and 12 are formed of a material mainly containing metal. For example, the electrode pads 11 and 12 include a Ti thin film as an adhesion layer and an Al thin film formed thereon. The electrode pads 11 and 12 are formed, for example, by using a method including metal sputtering film deposition, etching mask forming including photo lithography, and metal etching. The positions of the end faces of the through wirings 2 on the second surface 1b side are larger in depth than the positions of the end faces of the through wirings 2 on the first surface 1a side. More specifically, the vicinity of the end faces of the through wirings 2 on the second surface 1b side has more uneven substrate surface than other portions. However, to cope with this problem, metal thin films configuring the electrode pads 11 and 12 are formed by using the sputtering method with coating nature, providing good continuity of thin films. Comparatively high expansibility of metal thin films enables reducing damage by the stress of the electrode pads 11 and 12. The electrode pads 11 and 12 can be formed with lower accuracy than the element portion 30 and therefore can be formed with no difficulty even on the second surface 1b side having comparatively large surface unevenness.

Then, although not illustrated, the device (including the element portion 30, the through substrate 3, and the electrode pads 11 and 12) manufactured by the processes illustrated in FIGS. 1A to 1H is connected with a control circuit. This connection is made via the electrode pads 11 and 12 by using a connection method such as direct metal junction, bump junction, Anisotropic Conductive Film (ACF) compression bonding, and wire bonding.

Using the above-described manufacturing method enables manufacturing a device as illustrated in FIG. 1H. A substrate surface with a reduced depth of the end faces of the through wirings is formed on the through wiring substrate, and elements are formed on that surface side. Therefore, even in the vicinity of through wirings, the substrate surface has good uniformity in film thickness of the thin films configuring elements and in membrane stress. The end aces of the through wirings 2 provide good electrical connection with the element electrodes and the electrode pads. Further, on the surface side where elements are formed, unevenness on the substrate surface can be reduced to facilitate manufacturing of minute patterns. Therefore, it is possible to manufacture a device having small variations in the element characteristics and providing high electrical reliability through a comparatively small number of processes.

The devices according to the present disclosure include electronic devices including semiconductor devices and MEMS devices, and optical devices.

The device structure according to an exemplary embodiment of the present disclosure will be described below with reference to FIG. 2. FIG. 2 is a cross-sectional view illustrating a second exemplary embodiment. Although it is common that a plurality of through wirings or a plurality of elements is formed on one device, FIG. 2 illustrates only two through wirings and one element to make the drawing simple and legible.

As illustrated in FIG. 2, the device according to the present exemplary embodiment includes the through wiring substrate 3, the element portion 30, and the electrode pads 11 and 12. The through wiring substrate 3 includes the first substrate 1, the through holes 13 range from the first surface 1a of the first substrate 1 to the second surface 1b thereof disposed on the opposite side of the first surface 1a side, and the through wirings 2 formed of a conductive material for filling the insides of the through holes 13. The element portion 30 includes the first electrode 4, the second electrode 6, and the other portion 35. The element portion 30 is formed on the first surface 1a side of the first substrate 1. The first electrode 4 of the element portion 30 is electrically connected with the end face 2-1a of the through wiring 2-1. The second electrode 6 of the element portion 30 is electrically connected with the end face 2-2a of the through wiring 2-2. The electrode pads 11 and 12 are formed on the second surface 1b side of the first substrate 1. The electrode pad 11 is electrically connected with the end face 2-1b of the through wiring 2-1. The electrode pad 12 is electrically connected with the end face 2-2b of the through wiring 2-2. The positions of the end faces of the through wirings 2 on the first surface 1a side are smaller in depth than the positions of the end faces of the through wirings 2 on the second surface 1b side.

The first substrate 1 is selected according to the device performance. For example, the first substrate 1 is formed of an insulation material such as glass. The first substrate 1 may also be formed of either high-resistance silicon (Si) or low-resistance Si. The substrate 1 is, example, 100 to 1000 μm thick. According to the necessity of electrical insulation, an insulated film may be provided on the surfaces of the first surface 1a and the second surface 1b of the first substrate 1, and the surface of the first substrate 1 including the side walls of the through holes 13 for storing the through wirings 2.

The shape, the size, the number, and the arrangement of the through holes 13 are designed according to the specifications of the through wirings 2. The through holes 13, each being 20 to 100 μm in diameter, are arranged in an array form at 200 μm horizontal intervals and 2 mm vertical intervals. An insulated film or a diffusion preventing film for preventing metal diffusion is formed on the side wails of the through holes 13 as required. The through wirings 2 are formed of a conductive material. For example, the through wirings 2 are formed of a material containing metal. The through wirings 2 can be formed of a highly conductive material (Cu, Cu alloy, etc.) mainly containing Cu (which means that Cu occupies the most compositions according to the present specification).

The element portion 30 is, for example, any one of various kinds of MEMS elements. More specifically, the element portion 30 is, for example, the above-described CMUT or piezoelectric transducer. The element portion 30 is designed according to the device specifications. The electrode pads are formed of a material mainly containing metal. For example, the electrode pads 11 and 12 are formed of a Ti thin film. serving as an adhesion layer and an Al thin film formed thereon. Although not illustrated, a control circuit may be connected to the device illustrated in FIG. 2. This connection is made by, for example, direct metal junction via the electrode pads 11 and 12.

With the above-described device, the positions of the end faces of the through wirings 2 on the first surface 1a side where the element 30 is formed are smaller in depth than the positions of the end faces of the through wirings 2 on the second surface 1b side where the electrode pads 11 and 12 are formed. Such a structure reduces deformation and damage of the thin film configuring the element 30 in the vicinity of the end faces of the through wirings 2. On the first surface 1a including the vicinity of the end faces of the through wirings 2, the thin film configuring elements has good uniformity in film thickness and stress and therefore has small variations in the element characteristics. On the other hand, the electrode pads 11 and 12 have excellent expansibility of the metal material configuring them and therefore can be formed with no difficulty on the second surface 1b side where the positions of the end faces of the through wirings 2 are larger in depth than the positions of the end faces of the through wirings 2 on the first surface 1a side. Therefore, elements can be arranged in the vicinity of the through wirings 2.

The device having the above-described structure can be manufactured with simple manufacturing processes. This device has small variations in the element characteristics and provides high electrical reliability. Further, elements can be arranged in the vicinity of the through. wirings, increasing the integration degree of elements.

More specific exemplary embodiments will be described below.

A method for manufacturing a device according to a first exemplary embodiment of the present disclosure will be described below with reference to the cross-sectional views illustrated in FIGS. 3A to 3I. FIGS. 3A to 3I also illustrate only two through wirings and one element to make the drawings legible. First of all, the first substrate 1 is prepared, as illustrated in FIG. 3A. A Si substrate is used as the first substrate 1. The first substrate 1 has the first surface 1a and the second surface 1b which are polished to be a mirror surface to achieve the surface coarseness Pa smaller than 2 nm. The first substrate 1 has about 0.01 ohm·cm resistivity and an about 300 μm thickness.

Then, as illustrated in FIG. 3B, the through holes 13 range from the first surface 1a of the first substrate 1 to the second surface 1b thereof. The through holes 13 have an approximately cylindrical shape, and an about 50 μm aperture diameter on the first surface 1a and the second surface 1b of the first substrate 1. The through holes 13 are arranged in the first substrate 1 at 400 μm intervals. The through holes 13 are processed by using the deeply dug Si Reactive Ion Etching (RIE) technique. After processing with deeply dug RIE, the inner walls 13a of the through holes 13 are smoothed. Smoothing processing is performed by repeating twice the thermal oxidation on the surfaces of the first substrate 1 made of Si and the removal of the thermal oxide film. After smoothing, the surface coarseness Ra of the inner walls 13a of the through holes 13 becomes 100 nm or less.

Then, as illustrated in FIG. 3C, an insulated film 14 is formed on the surfaces of the first substrate 1 including the first surface 1a and the second surface 1b, and the inner walls 13a of the through holes 13. A Si thermal oxide film with an about 1 μm thickness is used as the insulated film 14. The Si thermal oxide film is formed by performing about 1000° C. heat-processing on the first substrate 1 having the through holes 13 formed as illustrated in FIG. 3B in the oxygen atmosphere. This completes the through substrate is.

Then, as illustrated in FIG. 3D, the seed substrate 50s is prepared. The seed substrate 50s formed of the second substrate 50, and the intermediate layer 51 and the seed film 52 formed on the second substrate 50. The second substrate 50 is a SUS substrate with an about 300 μm thickness. The main surface 50a of the second substrate 50 is planarized by machine polishing and has surface coarseness Ra of about 20 nm. As the intermediate layer 51, an Au thin film with about 10 nm thickness is formed on the main surface 50a of the second substrate 50 by using the vacuum evaporation method. Then, as the seed film 52, a Cu thin film with an about 50 nm thickness is formed on the intermediate layer 51 by using the vacuum evaporation method. This completes the seed substrate 50s. The seed film 52 of the seed substrate 50s obtained in this way is flat and smooth.

Then, as illustrated in FIG. 3E, the through substrate is illustrated in FIG. 3C and the seed substrate 50s illustrated in FIG. 3D are bonded together, and the through holes 13 are filled with Cu as the conductive material 2 (including the end faces 2-1 and 2-2) through electroplating. Then, the through substrate 1s and the seed substrate 50s are bonded together. To control the gap between the through substrate is and the seed substrate 50s, a nonionic surface-active agent (for example, see the descriptions of Japanese Patent plication Laid-Open No. 2012-28533) is used as the adhesive substance 53. The used nonionic surface-active agent dissolves in water or an organic solvent such as acetone, and has an about 40° C. melting point. The adhesive substance 53 is uniformly formed on the seed film 52 by using the spin coating method. After bonding together the through substrate 1s and the seed substrate 50s illustrated in FIG. 3D, the nonionc surface-active agent is about 4 μm thick. More specifically, after bonding together, the gap between the first surface 1a of the first substrate 1 and the seed film 52 is about 4 μm.

Before performing Cu plating, the through substrate 1s and the seed substrate 50s bonded together are immersed in water for about 5 seconds, and the nonionic surface-active agent at the bottoms of the through holes 13 is removed so that the seed film 52 is exposed at the bottoms of the through holes 13. Then, the portion of the seed film 52 exposed at the bottoms of the through holes 13 is disposed to face a phosphorus-containing copper anode. A Cu plating liquid which mainly contains copper sulfate is used as a plating liquid. At the time of plating, current is sent to the entire seed substrate 50s. Since the seed substrate 50s is entirely formed of metal and the seed film 52 is flat and smooth, highly uniform plating can be achieved, As a result, the start-of-plating end faces 2d (see FIG. 3F) of the conductive material 2 are about 4 μm in height and have good uniformity in height. Further, the end-of-plating end faces 2c have good uniformity in height protruding from the second surface 1b of the first substrate 1. Cu plating is performed until the protruding height of the end-of-plating end faces 2c becomes about 30 μm.

Then, as illustrated in FIG. 3F, the plated conductive material (Cu) 2 is separated from the second substrate 50 at the interface between the intermediate layer 51 and the second substrate 50. The intermediate layer 51 is an Au thin film with a 10 nm thickness and provides low adhesiveness to the second substrate 50 formed of SUS. The seed film 52 is a Cu thin film and provides high adhesion to the conductive material 2 formed of plated Cu. The intermediate layer 51 made of Au having a 10 nm thickness and the seed film 52 made of Cu having a 50 nm thickness are thin and easily torn. Therefore, the connection between the conductive material (Cu) 2 and the second substrate 50 can be broken only by applying small stress. The start-of-plating end faces 2d are hardly deformed or damaged by separation. After separation, the intermediate layer 51 and the seed film 52 partially adhere to the start-of-plating end faces 2d made of Cu.

Then, as illustrated in FIG. 3G, the end faces 2c and 2d of the conductive material 2 are planarized. Planarization is performed through CMP of Cu. In planarization, the portions of the intermediate layer 51 made of Au adhering to the end faces 2d have a small film thickness and are easily removed through CMP of Cu. Therefore, it is not necessary to separately remove a portion 51a of the intermediate layer 51 made of Au. After planarization, on the first surface 1a side of the first substrate 1, the end faces 2-1a and 2-2a of the through wirings 2 have an about 0.2 µm depth measured from the surface of the thermal oxide film 14 on the first surface 1a side. Further, on the second surface 1b, the end face; 2-1b and 2-2b of the through wirings 2 have an about 0.5 µm depth measured from the surface of the thermal oxide film 14 on the second surface 1b side. The conductive material of which the end faces have been planarized becomes the through wirings 2. This completes the through substrate 1s (see FIG. 3G) with the through. wirings 2 formed thereon, i.e., a through wiring substrate 3.

Then, as illustrated in FIG. 3H, an element portion 30 is formed on the first surface 1a of the first substrate 1. The element portion 30 is formed of electrode portions (including the first electrode 4 and the second electrode 6) and other portion 35. The electrodes are formed of a metal material. The first electrode 4 is electrically connected with the end face 2-1a of the through wiring 2. The second electrode 6 is electrically connected with the end face 2-2a of the through wiring 2. The element portion 30 is a CMUT or a piezoelectric transducer.

Then, as illustrated in FIG. 3I, on the second surface 1b side, electrode pads (including the electrode pads 11 and 12) to be electrically connected with end faces (including the end faces 2-1b and 2-2b) of the through wirings 2 are formed. The electrode pad 11 is connected with the end face 2-1b of the through wiring 2. The electrode pad 12 is connected with the end face 2-2b of the through wiring 2. The electrode pads 11 and 12 are formed of a Ti thin film with a 50 nm thickness and an Al thin film with a 500 nm thickness formed thereon. The electrode pads 11 and 12 are formed through the sputtering film deposition with good coating nature. In the formation process of the electrode pads 11 and 12, the highest substrate temperature is about 100° C.

Then, although not illustrated, the device (including the element portion 30, the through wirings 2, and the electrode pads 11 and 12) manufactured by the processes illustrated in FIGS. 3A. to 3I is connected to a control circuit. This connection is made via the electrode pads 11 and 12 by using the ACF compression bonding method. Also in the present exemplary embodiment, similar effects to the manufacturing method according to the above-described exemplary embodiment can be acquired.

Figure 4:
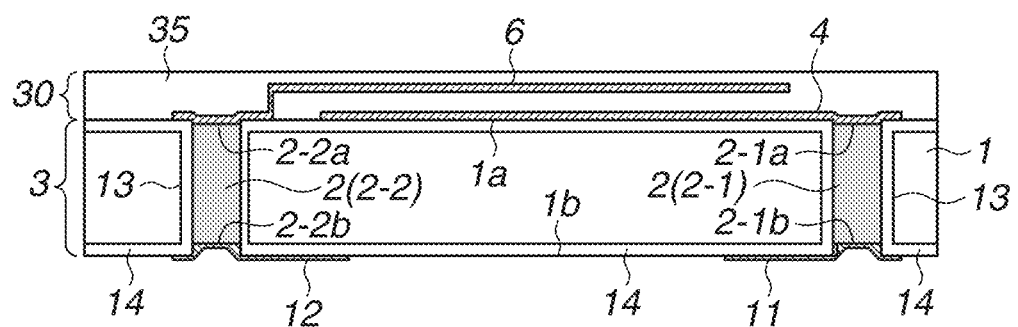
FIG. 4 is a cross-sectional view illustrating a structure of the device according to one or more aspects of the present disclosure.

A device according to a second exemplary embodiment of the present disclosure will be described below with reference to the cross-section illustrated in FIG. 4. FIG. 4 also illustrates only two through wirings and one element to make the drawing legible. As illustrated in FIG. 4, the device according to the present exemplary embodiment includes the through wiring substrate 3, the element portion 30, and the electrode pads 11 and 12. The through wiring substrate 3 includes the first substrate 1, the through holes 13 ranging from the first surface 1a to the second surface 1b of the first substrate 1, an insulated film 14 formed on the surface of the first substrate 1 including the inner walls of the through holes 13, and the through wirings 2 formed of a conductive material for filling the insides of the through holes 13. The element portion 30 includes the first electrode 4, the second electrode 6, and the other portion 35. The element portion 30 is formed on the first surface 1a side of the first substrate 1. The first electrode 4 of the element portion 30 is electrically connected with the end face 2-1a of the through wiring 2-1. The second electrode 6 electrically connected with the end face 2-2a of the through wiring 2-2. The electrode pads 11 and 12 are formed on the second surface 1b side of the first substrate 1. The electrode pad 11 is electrically connected with the end face 2-1b of the through wiring 2-1. The electrode pad 12 is electrically connected with the end face 2-2b of the through wiring 2-2.

The first substrate 1 is a Si substrate. The first substrate 1 has the first surface 1a and the second surface 1b which are polished to be a mirror surface to achieve surface coarseness Ra smaller than 2 nm. The first substrate 1 has about 0.01 ohm·cm resistivity and an about 300 µm thickness. The through holes 13, each being 20 µm in diameter, are arranged in an array form at 200 µm horizontal intervals and at 2 mm vertical intervals. The Si thermal oxide film 14 with about 1 µm thickness is formed as an insulated film on the side walls of the through holes 13.

The through wirings 2 are formed of a material mainly containing Cu. On the first surface as side of the first substrate 1, the end faces 2-1a and 2-2a of the through. wirings 2 have an about 0.2 µm depth measured from. the surface of the thermal oxide film 14 on the first surface 1a side. Further, on the second surface 1b side, the end faces 2-1b and 2-2b of the through wirings 2 have an about 0.5 µm depth measured from the surface of the thermal oxide film 14 on the second surface 1b side. The element portion 30 is a CMUT. The CMUT includes the first electrode 4, the second electrode 6 disposed to face the first electrode 4 across a gap, and a vibratably supported vibrating membrane consisting of insulated films disposed above and below the second electrode 6. The electrode pads (including the electrode pads 11 and 12) are formed of a Ti thin film with a 50 nm thickness and an Al thin film with a 500 nm thickness formed thereon. Further, although not illustrated, a control circuit is connected to the device illustrated in FIG. 4. This connection is made via the electrode pads 11 and 12 by using the ACF compression bonding method. Also in the present exemplary embodiment, similar effects to the device according to the above-described exemplary embodiment can be acquired.

Figure 5:
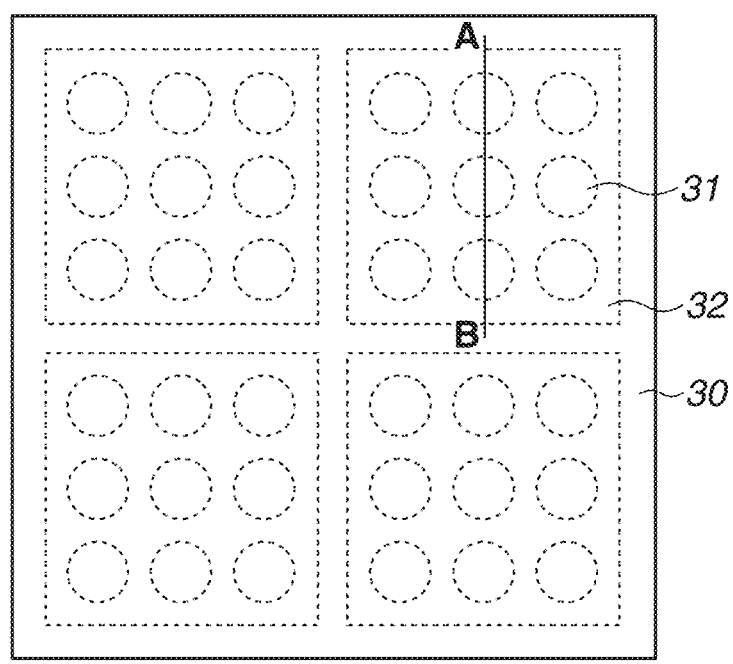
FIG. 5 is a plan view illustrating a method for manufacturing the device according to one or more aspects of the present disclosure.

A method for manufacturing a device according to a third exemplary embodiment of the present disclosure will be described below with reference to the plan view illustrated in FIG. 5 and the cross-sectional views illustrated in FIGS. 6A to 6K. The present exemplary embodiment will be described below centering on an example of a manufacturing method in which a CMUT is formed on a through wiring substrate by using the Via first method. A CMUT is a capacitive transducer capable of transmitting and receiving an acoustic wave such as an ultrasonic wave by using a vibration of a vibrating membrane and, especially in liquid, easilv acquiring the excellent broadband characteristics. Practically, as illustrated in the plan view illustrated in FIG. 5, one CMUT device consists of an element portion 30 which includes a plurality of elements 32 arranged on a substrate, each element 32 including a plurality of vibrating membranes (also referred to as cells) 31 arranged in a two-dimensional array form. The desired performance is achieved in this way. To independently control each element 32, a wiring portion is formed for each element 32. Cell structures illustrated in FIGS. 6A to 6K to be referenced in the description of manufacturing processes are as illustrated in the cross-section taken along the line A-B illustrated in FIG. 5. To simplify the description, FIGS. 6A to 6K illustrate only one cell (one vibrating membrane) and one pair of through wirings of the CMUT.

Figure 6A:
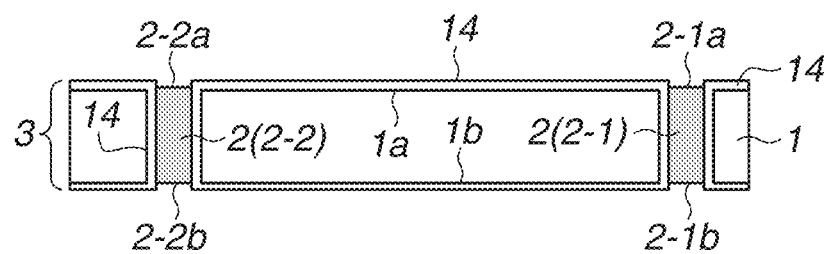
FIGS. 6A, 6B, 6C, 6D, 6E, 6F, 6G, 6H, 6I, 6J and 6K are the cross-sectional views illustrating the method for manufacturing a device according to one or more aspects of the present disclosure.
Figure 6B:
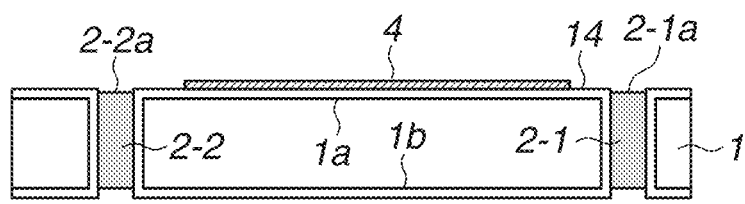
Figure 6C:
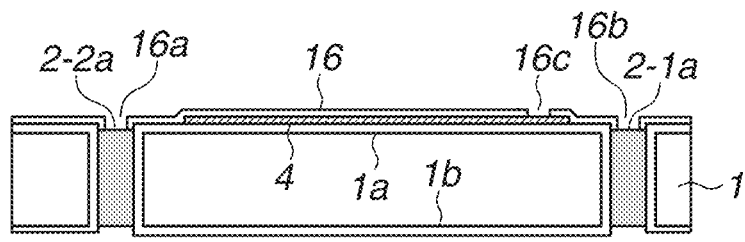
Figure 6D:
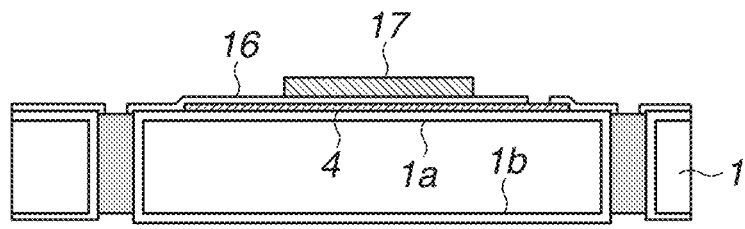
Figure 6E:
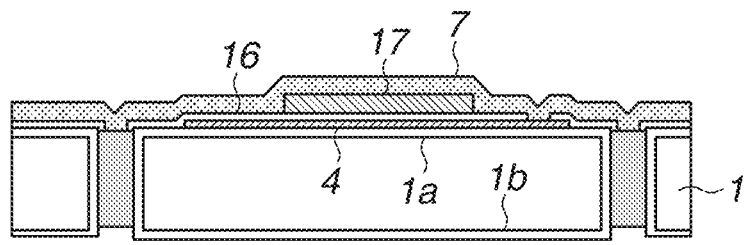
Figure 6F:
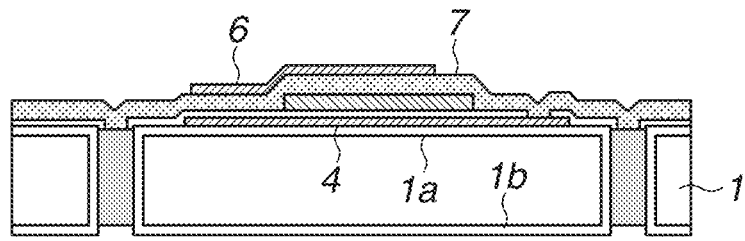
Figure 6G:
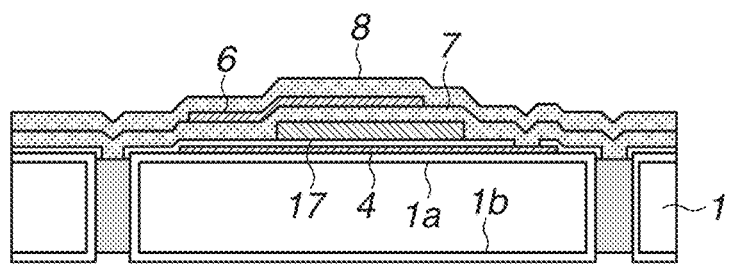
Figure 6H:
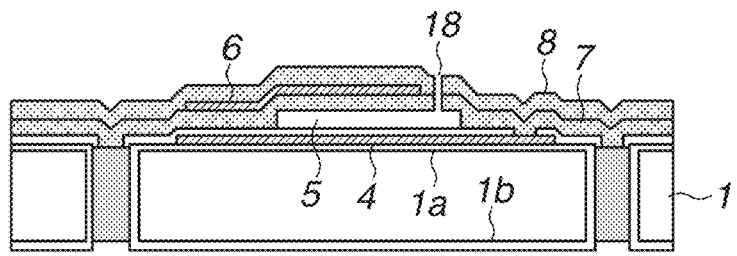
Figure 6I:
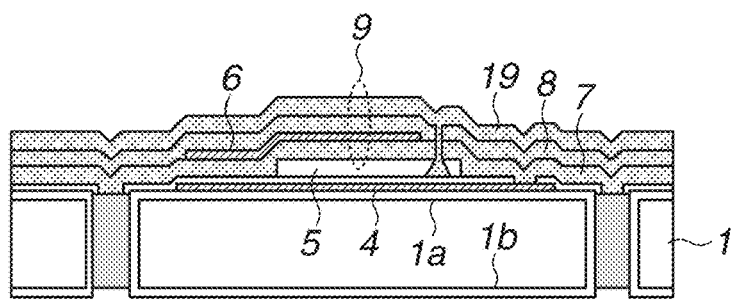
Figure 6J:
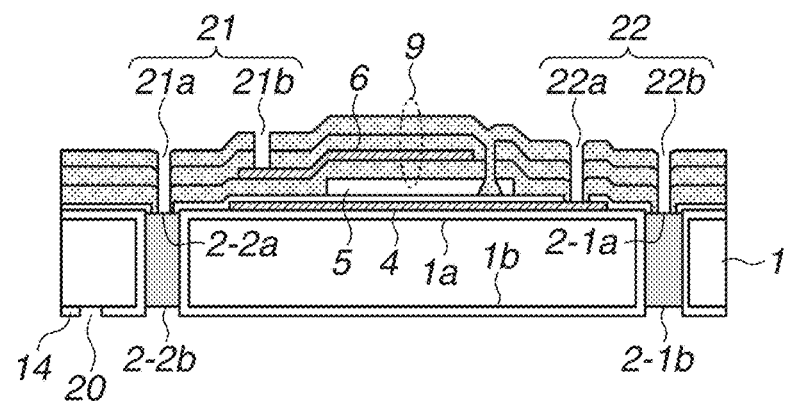
Figure 6K:
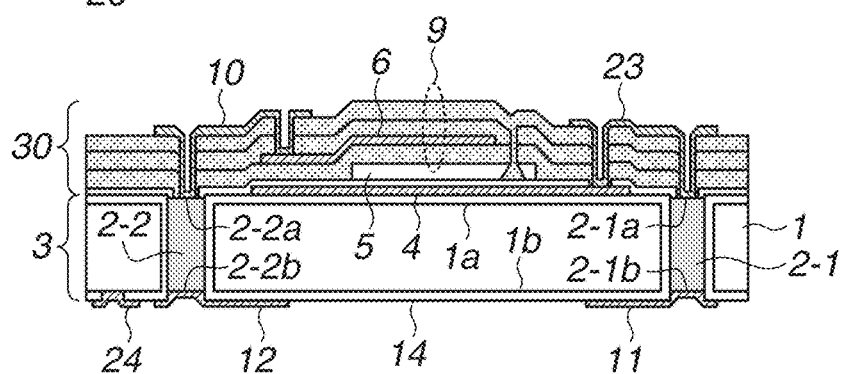

As illustrated in FIG. 6K, in the CMUT according to the present exemplary embodiment, the element portion 30 is formed on the first surface 1a of the through wiring substrate 3, and electrode pads (including the electrode pads 11, 12, and 24) are formed on the second surface 1b of the through wiring substrate 3. The through wirings 2 (including the end faces 2-1 and 2-2) are electrically connected with the element portion 30 on the first surface side of the through wiring substrate 3 and are electrically connected with the electrode pads 11 and 12 on the second surface 1b side of the through wiring substrate 3. The element portion 30 includes cells each including the first electrode 4, the second electrode 6 disposed to face the first electrode 4 across a gap 5, and a vibratably vibrating membrane 9 consisting of insulated films (including insulated films 7, 8, and 19) disposed above and below the second electrode 6. The first electrode 4 is connected with the electrode pad 11 via the through wiring 2-1. The second electrode 6 is connected with the electrode pad 12 via the through wiring 2-2.

First of all, as illustrated in FIG. 6A, the through wiring substrate 3 is prepared. The through wiring substrate 3 is manufactured by the method described with reference to FIGS. 3A to 3G according to the first exemplary embodiment. The first substrate 1 is a Si substrate with double-sided mirror polish and has surface coarseness Ra smaller than 2 nm, about 0.01 ohm·cm resistivity, and a 250 µm thickness. The through holes 13 (see FIG. 3B) have an approximately cylindrical shape, and an about 50 µm aperture diameter on the first surface 1a and the second surface 1b of the first substrate 1. The Si thermal oxide 14 having an about 1 µm thickness is formed as an insulated film on the surface of the first substrate 1 including the first surface 1a, the second surface 1b, and. the inner walls 13a of the through holes 13 of the first substrate 1. The through wirings 2 (including the end faces 2-1 and 2-2) mainly containing Cu are formed in the through holes 13 through electroplating. The end faces (including the end faces 2-1a, 2-1b, 2-2a, and 2-2b) of the through wirings 2 are planarized through CMP. After planarization, on the first surface 1a side of the first substrate 1, the end faces 2-1a and 2-2a of the through wirings 2 have an about 0.2 µm depth measured from the surface of the thermal oxide film 14 on the first surface 1a side. Further, on the second surface 1b side, the end faces 2-1b and 2-2b of the through wirings 2 have an about 0.5 µm depth measured from the surface of the thermal oxide film 14 on the second surface 1b side. Two through wirings 2 are formed for one element 32 (see FIG. 5) of the CMUT.

Then, as illustrated in FIG. 6B, the first electrode 4 is formed on the first surface 1a side of the first substrate 1. The first electrode 4 is formed as one of electrodes for driving the vibrating membrane 9 (see FIG. 6K). Since the first electrode 4 is formed on the Si thermal oxide film 14, it is insulated from. the first substrate 1. The first electrode 4 is positioned at the lower part of the vibrating portion of the vibrating membrane 9 of a cell (the portion corresponding to the gap 5 illustrated in FIG. 6K) and is extended around from the vibrating portion of the vibrating membrane 9. The first electrode 4 is formed to be electrically connected with each cell in the same element. The first electrode 4 is formed by laminating a Ti thin film with an about 10 nm thickness and a W thin film with an about 50 nm thickness. The first electrode 4 is formed by using a method including metal film deposition, etching mask forming including photo lithography, and metal etching.

Then, as illustrated in FIG. 6C, the pattern of an insulated film 16 is formed. The insulated film 16 covers the surface of the first electrode 4 and plays a role of an insulated protective film for the first electrode 4. The insulated film 16 is a Si oxide thin film with a 200 nm thickness. The Si oxide thin film is formed by using the Chemical Vapor Deposition (CVD) method at the substrate temperature of about 300° C. After Si oxide film deposition, apertures 16a, 16b, and 16c are formed on the insulated film 16. The apertures 16a, 16b, and 16c are formed by using a method including etching mask forming including photo lithography and dry etching including reactive ion etching.

Then, as illustrated in FIG. 6D, a sacrifice layer 17 is formed. The sacrifice layer 17 made of Cr is used to form the gap 5 between cells. The thickness aid shape of the sacrifice layer 17 are determined by the required CMUT characteristics. First of all, a Cr film with a 200 nm thickness is formed on the first surface 1a of the first substrate 1 by using the electron beam evaporation method. Then, the Cr film is processed into a desired shape by using a method including photo lithography and wet etching. The sacrifice layer 17 has a cylindrical structure with an about 30 µm diameter and an about 200 nm height, and communicates with an etching hole 18 formed as illustrated in FIG. 6H.

Then, as illustrated in FIG. 6E, an insulated film 7 is formed. The insulated film 7 contacts the bottom surface of the second electrode 6 formed as illustrated in FIG. 6F and plays a role of an insulated protective film for the second electrode 6. The insulated film 7 is a Si nitride with a 400 nm thickness. The Si nitride thin film is formed by using the Plasma Enhanced Chemical Vapor Deposition (PE-CVD) method at the substrate temperature of about 300° C. At the time of film deposition, the flow rate of film deposition gas is controlled so that the Si nitride film serving as the insulated film 7 has tensile stress of about 0.1 GPa.

Then, as illustrated in FIG. 6F, the second electrode 6 is formed. The second electrode 6 is formed to face the first electrode 4 in the vibrating membrane 9 (see FIG. 6K) as one of electrodes for driving the vibrating membrane 9. The second electrode 6 is formed by laminating a 10 nm Ti film and a 100 nm AlNd alloy film in this order. The second electrode 6 is formed, for example, by using a method including metal sputtering film deposition, etching mask forming including photo lithography, and metal etching. When the manufacture of a CMUT is completed, deposition conditions are adjusted so that the second electrode 6 has tensile stress of 0.4 GPa or less. The second electrode 6 is formed to be electrically connected with each cell in the same element.

Then, as illustrated in FIG. 6G, the insulated film 8 is formed. The insulated film 8 covers the upper surface of the second electrode 6 and plays a role of an insulated protective film for the second electrode 6. The insulated film 8 has a similar configuration to that of the insulated film 7 and is formed by a similar method to that for the insulated film 7.

Then, as illustrated in FIG. 6H, the etching hole 18 is formed and the sacrifice layer 17 is removed. The etching hole 18 is formed by using a method including photo lithography and reactive ion etching. Then, the sacrifice layer 17 (see FIG. 6G) made of Cr is removed by introducing an etching solution through the etching hole 18. This completes the formation of the gap 5 having the same shape as the sacrifice layer 17.

Then, as illustrated in FIG. 6I, the thin film 19 is formed. The thin film 19 seals the etching hole 18 and at the same time configures the vibrating membrane 9 which can vibrate at the upper part of the gap 5 together with the insulated film 7, the second electrode 6, and the insulated film 8. The thin film 19 is a Si nitride with a 800 nm thickness. Similar to the insulated film 7, the thin film 19 is formed by using the PE-CVD method at the substrate temperature of about 300° C. The entire vibrating membrane 9 formed in this way has tensile stress of about 0.7 GPa to be free from sticking or buckling and a structure which is hardly destroyed. The configuration (material, thickness, and stress) of the vibrating membrane 9 is designed based on the required CMUT characteristics. The above-described configuration of the vibrating membrane is to be considered as an example for describing a manufacturing method.

Then, as illustrated in FIG. 6J, contact holes 20, 21 (including contact holes 21a and 21b), and 22 (including contact holes 22a and 22b) for electrical connection are formed. The contact hole 20 is an aperture formed on the second surface 1b side of the first substrate 1 to partially expose the second surface 1b. The contact holes 21 and 22 are formed. on the first surface 1a side of the first substrate 1. The contact hole 21a is an aperture for partially exposing the end face 2-2a of the through wiring 2-2. The contact hole 21b is an aperture for partially exposing the surface of the second electrode 6. The contact hole 22a is an aperture for partially exposing the surface of the first electrode 4. The contact hole 22b is an aperture for partially exposing the end face 2-1a of the through wiring 2-1. The contact hole 20 is formed by using a method including etching mask forming including photo lithography and etching of Si thermal oxide by use of buffered hydrofluoric acid (BHF). The contact holes 21 and are formed by using a method including etching mask forming including photo lithography and reactive ion etching of Si nitride. The contact holes 20, 21, and 22 has, for example, about 10 μm diameter and a cylindrical shape.

Then, as illustrated in FIG. 6K, the connection wirings 10 and 23 and the electrode pads 11, 12, and 24 are formed. The connection wirings 10 and 23 are formed on the first surface 1a side of the first substrate 1 by laminating a Ti film with an about 10 nm thickness and an Al film with an about 500 nm thickness in this order. The connection wiring 10 electrically connects the second electrode 6 and the end face 2-2a of the through wiring 2-2 via the contact holes 21 (including the contact holes 21a and 21b (refer to FIG. 6J)). The connection wiring 23 electrically connects the first electrode 4 and the end face 2-1a of the through wiring 2-1 via the contact holes 22 (including the contact holes 22a and 22b (refer to FIG. 6J)). The electrode pads 11, 12, and 24 are formed on the second surface 1b side of the first substrate 1 and are formed of an Al film with an about 500 nm thickness. The electrode pad 11 is formed to connect with the end face 2-1b of the through wiring 2-1. The electrode pad 12 is formed to connect with the end face 2-2b of the through wiring 2-2. As a result, the first electrode 4 on the first surface 1a side of the first substrate 1 is pulled out to the second surface 1b side of the first substrate 1 via the through wiring 2-1. Likewise, the second electrode 6 on the first surface 1a side of the first substrate 1 is pulled out to the second surface 1b side of the first substrate 1 via the through wiring 2-2. The electrode pad 24 is formed to connect with the first substrate 1.

In the manufacturing processes of the above-described insulated films 7, 8, and 19, to improve the adhesiveness between these films, plasma processing may be performed on the surface of a lower layer film before forming an upper layer film. The surface of the lower layer film is cleaned or activated by the plasma processing.

Then, although not illustrated, the SMUT manufactured as illustrated in FIGS. 6A to 6K is connected with a control circuit via the electrode pads 11, 12, and 24 by using the ACF compression bonding method. In the SMUT manufactured by the above-described manufacturing method, in each element 32, at least either one of the first and the second electrodes of each cell is electrically connected with the control circuit. When driving, a bias voltage is applied to the first electrode 4, and the second electrode 6 is used as an electrode for signal application or signal extraction. Signal noise can be reduced by connecting the first substrate 1 to a good ground via the electrode pad 24. The present exemplary embodiment also obtains similar effects to those with the manufacturing method according to the above-described exemplary embodiment.

A fourth exemplary embodiment will be described below centering on an example of an application of the SMUT manufactured in the third exemplary embodiment. The SMUT manufactured in the third exemplary embodiment can be used for a subject information acquisition apparatus such as an ultrasonic diagnostic apparatus and an ultrasonographic image forming apparatus utilizing an acoustic wave. The CMUT receives an acoustic wave from a subject and uses an output electrical signal to enable acquiring subject information reflecting the subject's optical characteristic values such as the optical absorption coefficient and subject information reflecting acoustic impedance differences.

Figure 7A:
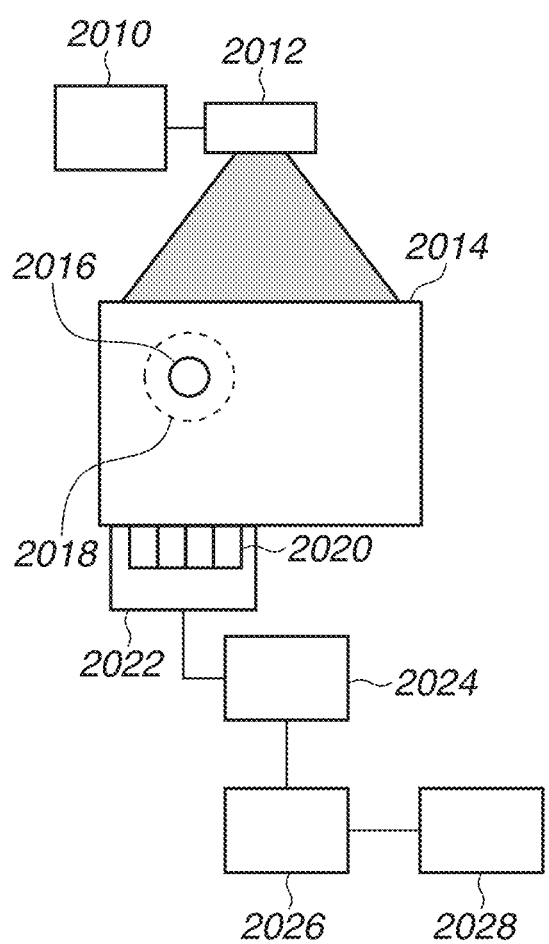
FIGS. 7A and 7B are plan views illustrating an example of an application of the device according to one or more aspects of the present disclosure.

FIG. 7A illustrates subject information acquisition apparatus using photoacoustic effect according to an exemplary embodiment. A subject 2014 is irradiated with pulsed light emitted from a light source 2010 via optical members 2012 such as a lens, a mirror, and an optical fiber. An optical absorber 2016 included in the subject 2014 absorbs the energy of the pulsed light to generate a photoacoustic wave 2018 that is an acoustic wave. A device 2020 including the electromechanical converter (CMUT) according to the present disclosure in a probe 2022 receives the photoacoustic wave 2018, converts the acoustic wave into an electrical signal, and outputs the electrical signal to a signal processing unit 2024. The signal processing unit 2024 performs signal processing such as analog-to-digital (A/D) conversion and amplification on the input electrical signal and outputs the processed signal to a data processing unit 2026. Based on the input signal, the data processing unit 2026 acquires subject information (characteristic information reflecting the subject's optical characteristic values such as the optical absorption coefficient) as image data. In this case, the signal processing unit 2024 and the data processing unit 2026 are collectively referred to as a processing unit. A display unit 2028 displays an image based on the image data input from the data processing unit 2026. As described above, the subject information acquisition apparatus according to the present exemplary embodiment includes the device according to the present disclosure, the light source, and the processing unit. The device receives a photoacoustic wave generated when the subject is irradiated with light emitted from the light source and coverts the photoacoustic wave into an electrical signal. The processing unit acquires subject information by using the electrical signal.

Figure 7B:
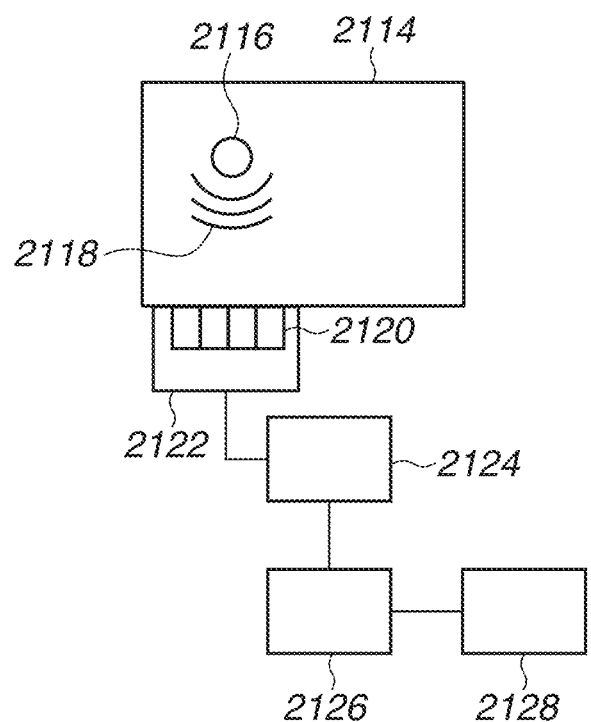

FIG. 7B illustrates a subject information acquisition apparatus such as ultrasonic echo diagnostic apparatus using reflection of an acoustic wave. A acoustic wave transmitted from a e dvice 2120 including the electric mechanical converter (CMUT) according to the present invention disclosure in a probe 2122 to a subject 2114 is reflected by a reflector 2116. The device 2120 receives a reflected acoustic wave (reflected wave) 2118, converts the reflected acoustic wave 2118 into an electrical signal, and outputs the electrical signal to a signal processing unit 2124. The signal processing unit 2124 performs signal processing such as A/D conversion and amplification on the input electrical signal and outputs the processed signal to a data processing unit 2126. Based on the input signal, the data processing unit 2126 acquires subject information (characteristic information reflecting acoustic impedance differences) as image data. Also in this case, the signal processing unit 2124 and the data processing unit 2126 are collectively referred to as a processing unit. A display unit 2128 displays an image based on the image data input from the data processing unit 2126. As described above, the subject information acquisition apparatus according to the present exemplary embodiment includes the device according to the present disclosure and the processing unit for acquiring subject information by using an electrical signal output by the device. The device receives an acoustic wave from the subject and outputs an electrical signal.

The probe may be a mechanical scan type or a handheld type which is moved on a subject by a user such as a doctor or an engineer. In the case of an apparatus using a reflected wave, as illustrated in FIG. 7B, a probe for transmitting an acoustic wave nay be provided separately from a probe for receiving an acoustic wave. The subject information acquisition. apparatus may be provided with all of the functions of the apparatuses illustrated in FIGS. 7A and 7B, and acquire subject information reflecting the subject's optical characteristic values and subject information reflecting acoustic impedance differences. In this case, the device 2020 illustrated in FIG. 7A may not only receive a photoacoustic wave but also transmit an acoustic wave and receive a reflected wave. The above-described CMUT may also be used in a measuring apparatus for measuring the magnitude of an external force. In this case, the measuring apparatus measures the magnitude of an external force applied to the surface of a CMUT by using an electrical signal from the CMUT which receives the external force.

According to the present disclosure, a through wiring substrate is provided with a substrate surface having a reduced depth of the end faces of through wirings. Therefore, forming element portions on that surface side enables manufacturing a device having small variations in the characteristics of the element portions and providing high electrical reliability.

While the present disclosure has been described with reference to exemplary embodiments, the scope of the following claims are to be accorded the broadest interpretation so as to encompass all such modifications and equivalent structures and functions.

This application claims the benefit of Japanese Patent Application No. 2015-234361, filed Dec. 1, 2015, which is hereby incorporated by reference herein in its entirety.

What is claimed is:

1. A device comprising:
   a through holes ranging from a first surface of a substrate to a second surface thereof positioned on an opposite side of the first surface;
   through wiring formed of a conductive material for filling an inside of the through hole, and the through wiring is recessed from the first surface of the substrate and the second surface of the substrate; and
   an element portion disposed on the first surface side and electrically connected with the through wirings,
   wherein the element portion is formed so as to cover an end surface of the through wiring on the first surface side and an edge of the through hole on the first surface side, and
   wherein a distance from the first surface to the end surface of the through wiring on the first surface side is smaller than a distance from the second surface to an end surface of the through wiring on the second surface side.

2. The device according to claim 1, wherein the element portion is provided with a vibration member.

3. The device according to claim 1, wherein the element portion is a capacitive transducer or a piezoelectric transducer.

4. A subject information acquisition apparatus comprising:
   a processing unit configured to acquire information about a subject by using the device according to claim 1; and
   an electrical signal output by the device, wherein the device receives an acoustic wave from the subject and converts the acoustic wave into an electrical signal.

5. The subject information acquisition apparatus according to claim 4, further comprising a light source,
   wherein the device receives a photoacoustic wave generated when the subject is irradiated with light emitted from the light source and converts the photoacoustic wave into an electrical signal, and
   wherein the processing unit acquires information about the subject by using the electrical signal from the device.

6. A subject information acquisition apparatus comprising:
   the device according to claim 1;
   a light source; and
   a processing unit configured to acquire information about a subject by using an electrical signal output by the device, wherein the device receives an acoustic wave generated when the subject is irradiated with light emitted from the light source and converts the acoustic wave into an electrical signal.

* * * * *